United States Patent
Mueller

(10) Patent No.: US 7,501,022 B2
(45) Date of Patent: Mar. 10, 2009

(54) METHODS OF FABRICATING SILICON CARBIDE CRYSTALS

(75) Inventor: Stephan Mueller, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 11/542,987

(22) Filed: Oct. 4, 2006

(65) Prior Publication Data

US 2007/0022945 A1 Feb. 1, 2007

Related U.S. Application Data

(63) Continuation of application No. 10/756,542, filed on Jan. 13, 2004, now Pat. No. 7,135,072, which is a continuation of application No. 09/862,108, filed on May 21, 2001, now Pat. No. 6,706,114.

(51) Int. Cl.
*C30B 28/12* (2006.01)

(52) U.S. Cl. .............. 117/84; 117/88; 117/94; 117/97; 117/911; 117/951

(58) Field of Classification Search .......... 117/84, 117/88, 94, 97, 911, 951
See application file for complete search history.

(56) References Cited

U.S. PATENT DOCUMENTS

| | | | | |
|---|---|---|---|---|
| 3,990,093 A | 11/1976 | Cline et al. | ............... | 257/45 |
| 4,522,661 A | 6/1985 | Morrison et al. | ........... | 148/33.2 |
| 4,866,005 A | 9/1989 | Davis et al. | ................. | 437/100 |
| 4,875,083 A | 10/1989 | Palmour | .................... | 357/23.6 |
| 4,897,149 A | 1/1990 | Suzuki et al. | ............... | 156/610 |
| 5,037,502 A | 8/1991 | Suzuki et al. | ............... | 156/610 |
| 5,211,801 A | 5/1993 | Stein | .......................... | 156/603 |
| 5,279,701 A | 1/1994 | Shigeta et al. | .............. | 156/612 |
| 5,288,365 A | 2/1994 | Furukawa et al. | ........... | 156/614 |
| RE34,861 E | 2/1995 | Davis et al. | ................. | 437/100 |
| 5,433,167 A | 7/1995 | Furukawa et al. | ............. | 117/84 |
| 5,441,011 A | 8/1995 | Takahaski et al. | ............. | 117/84 |
| 5,450,205 A | 9/1995 | Sawin et al. | ................. | 356/632 |
| 5,707,446 A | 1/1998 | Völkl et al. | ................... | 117/200 |

(Continued)

FOREIGN PATENT DOCUMENTS

EP 0962963 A1 12/1999

OTHER PUBLICATIONS

Charles Eric Hunter, U.S. Appl. No. 09/361,945, *Growth of Bulk Single Crystals of Aluminum Nitride.* filed Jul. 27, 1999.
Peter Råbick, *Modeling of the Sublimation Growth of Silicon Carbide Crystals.* Dissertation, Helsinki University of Technology, Jun. 30, 1999.

*Primary Examiner*—Robert M Kunemund
*Assistant Examiner*—Matthew J Song
(74) *Attorney, Agent, or Firm*—Myers Bigel Sibley & Sajovec

(57) ABSTRACT

Methods for producing silicon carbide crystals, seed crystal holders and seed crystal for use in producing silicon carbide crystals and silicon carbide crystals are provided. Silicon carbide crystals are produced by forcing nucleation sites of a silicon carbide seed crystal to a predefined pattern and growing silicon carbide utilizing physical vapor transport (PVT) so as to provide selective preferential growth of silicon carbide corresponding to the predefined pattern. Seed holders and seed crystals are provided for such methods. Silicon carbide crystals having regions of higher and lower defect density are also provided.

8 Claims, 4 Drawing Sheets

U.S. PATENT DOCUMENTS

| | | | |
|---|---|---|---|
| 5,718,760 A | 2/1998 | Carter et al. | 117/84 |
| 5,746,827 A | 5/1998 | Barrett et al. | 117/100 |
| 5,753,038 A * | 5/1998 | Vichr et al. | 117/97 |
| 5,853,478 A | 12/1998 | Yonehara et al. | 117/89 |
| 5,858,086 A | 1/1999 | Hunter et al. | 117/84 |
| 5,873,937 A | 2/1999 | Hopkins et al. | 117/105 |
| 5,895,526 A | 4/1999 | Kitoh et al. | 117/84 |
| 5,944,890 A | 8/1999 | Kitou et al. | 117/101 |
| 5,954,874 A | 9/1999 | Hunter | 117/84 |
| 5,958,132 A | 9/1999 | Takahashi et al. | 117/84 |
| 5,964,943 A | 10/1999 | Stein et al. | 117/88 |
| 5,964,944 A | 10/1999 | Sugiyama et al. | 117/107 |
| 5,968,261 A | 10/1999 | Barrett et al. | 117/13 |
| 5,968,265 A | 10/1999 | Stein et al. | 117/71 |
| 5,972,109 A | 10/1999 | Hunter | 117/84 |
| 5,985,026 A | 11/1999 | Völkl et al. | 117/95 |
| 5,989,340 A | 11/1999 | Stephani et al. | 117/204 |
| 6,025,289 A | 2/2000 | Carter et al. | 501/86 |
| 6,045,612 A | 4/2000 | Hunter | 117/84 |
| 6,045,613 A | 4/2000 | Hunter | 117/84 |
| 6,048,813 A | 4/2000 | Hunter | 501/86 |
| 6,051,849 A | 4/2000 | Davis et al. | 257/103 |
| 6,053,973 A | 4/2000 | Tanino et al. | 117/4 |
| 6,056,820 A * | 5/2000 | Balakrishna et al. | 117/200 |
| 6,063,185 A | 5/2000 | Hunter | 117/84 |
| 6,066,205 A | 5/2000 | Hunter | 117/200 |
| 6,086,672 A | 7/2000 | Hunter | 117/84 |
| 6,143,267 A | 11/2000 | Tanino | 423/345 |
| 6,153,165 A | 11/2000 | Tanino | 423/345 |
| 6,153,166 A | 11/2000 | Tanino | 423/345 |
| 6,177,688 B1 | 1/2001 | Linthicum et al. | 257/77 |
| 6,187,279 B1 | 2/2001 | Tanino et al. | 423/345 |
| 6,193,797 B1 | 2/2001 | Shiomi et al. | 117/88 |
| 6,203,772 B1 | 3/2001 | Tanino et al. | 423/345 |

* cited by examiner

METHODS OF FABRICATING SILICON CARBIDE CRYSTALS

RELATED APPLICATIONS

The present application is a continuation of and claims priority from U.S. patent application Ser. No. 10/756,542, filed Jan. 13, 2004, now U.S. Pat. No. 7,135,072, which is a continuation of U.S. patent application Ser. No. 09/862,108, filed May 21, 2001, entitled Seed Crystal Holders and Seed Crystals for Fabricating Silicon Carbide Crystals and Methods of Fabricating Silicon Carbide Crystals (now U.S. Pat. No.6,706,114), the disclosures of which are incorporated herein as if set forth fully herein.

FIELD OF THE INVENTION

The present invention relates to the fabrication of semiconductor materials and, more particularly, to devices for use in fabricating silicon carbide crystals and the fabrication of silicon carbide crystals, for example, to produce silicon carbide boules from which a silicon carbide wafer may be provided.

BACKGROUND OF THE INVENTION

Silicon carbide (SiC) is rarely found in nature. It has, however, been manufactured for more than eighty years, in crystalline form, for abrasive products. Silicon carbide crystals found in nature and in abrasive products are generally black and not translucent because they contain substantial levels of impurity atoms.

In the 1950's the Lely process was developed at General Electric Company by which silicon carbide was sublimed and randomly deposited to produce small, thin silicon carbide crystals that were used in early silicon carbide semiconductor device development.

Because of the theoretically quite favorable electronic properties of silicon carbide, significant development activities were initiated during the 1960's and 1970's with the objective of growing large (bulk) crystals of low impurity silicon carbide for use in the production of semiconductor devices. These efforts finally resulted in the commercial availability of relatively low impurity, translucent silicon carbide crystals.

North Carolina State University was issued U.S. Pat. Nos. 4,866,005 and Re. 34,861 on the growth of single crystal silicon carbide through a sublimation process. The disclosure of U.S. Pat. Nos. 4,866,005 and Re. 34,861 are incorporated herein by reference as if set forth fully herein. Since that time, the growth of silicon carbide crystals has been described in several U.S. Patents, including commonly assigned U.S. Pat. No. 6,045,613 entitled "PRODUCTION OF BULK SINGLE CRYSTALS OF SILICON CARBIDE," the disclosure of which is incorporated herein by reference as if set forth fully herein. Additional patents relating to the growth of silicon carbide or silicon carbide alloys include commonly assigned U.S. Pat. No. 6,048,813 entitled "SIMULATED DIAMOND GEMSTONES FORMED OF ALUMINUM NITRIDE AND ALUMINUM NITRIDE: SILICON CARBIDE ALLOYS," and U.S. Pat. No. 6,086,672 entitled "GROWTH OF BULK SINGLE CRYSTALS OF ALUMINUM NITRIDE: SILICON CARBIDE ALLOYS," the disclosures of which are incorporated herein by reference as if set forth fully herein.

One difficulty with silicon carbide is that silicon carbide may contain micropipes or other defects, such as dislocation defects. Such defects may reduce the suitability of regions of a silicon carbide wafer containing such defects for use in a semiconductor device. For example, a transistor with such defects incorporated therein may have a higher leakage current than a corresponding transistor without such defects. Accordingly, improvements may be needed in the growth of silicon carbide crystals.

In gallium arsenide (GaAs) and gallium nitride (GaN) growth through chemical vapor deposition (CVD), epitaxial lateral overgrowth (ELOG) and pendeo-epitaxial growth techniques have been utilized to reduce defects in layers of GaAs or GaN. Such techniques are, for example, illustrated in U.S. Pat. No. 4,522,661. U.S. Pat. No. 6,051,849 and U.S. Pat. No. 6,177,688. However, growth of silicon carbide crystals (e.g. boules) suitable for providing wafers or substrates is typically not carried out using CVD processes but is performed using physical vapor transport (PVT) growth, such as through a sublimation growth process as described above.

SUMMARY OF THE INVENTION

Embodiments of the present invention provide methods for producing silicon carbide crystals, seed crystal holders and seed crystals for use in producing silicon carbide crystals and silicon carbide crystals. According to embodiments of methods according to the present invention, silicon carbide crystals are produced by forcing nucleation sites of a silicon carbide seed crystal to a predefined pattern (e.g. non-random) and growing silicon carbide utilizing physical vapor transport (PVT) so as to provide selective preferential growth of silicon carbide corresponding to the predefined pattern.

In further embodiments of the present invention, nucleation sites are forced to the predefined pattern by modulating a thermal profile of the seed crystal. Such a modulation may be provided by forming regions of higher thermal conductivity in a seed crystal holder. The regions of higher thermal conductivity correspond to the predefined pattern. The seed crystal is mounted on the seed crystal holder.

The regions of higher thermal conductivity may be formed by removing portions of the seed crystal holder so that the seed crystal selectively contacts the seed crystal holder. The regions of higher thermal conductivity may correspond to regions where the seed crystal contacts the seed crystal when the seed crystal is mounted on the seed crystal holder.

Alternatively, the regions of higher thermal conductivity may be formed by removing portions of the seed crystal holder so as to provide cavities in the seed crystal holder and filling the cavities in the seed crystal holder with a material having a higher thermal conductivity than a material of the seed crystal holder. Such cavities may be filled by covering the seed crystal holder with a layer of the material having a higher thermal conductivity and removing a sufficient amount of the layer of the material of higher thermal conductivity so as to expose portions of the seed crystal holder. In particular embodiments of the present invention, the material of the seed crystal holder is graphite and the material of higher thermal conductivity is silicon carbide.

In further embodiments of the present invention, the predefined pattern may be stripes in the seed crystal holder. The predefined pattern could also be a pattern of posts in the seed crystal holder. The posts may be substantially circular.

In additional embodiments of the present invention, the nucleation sites may be forced to a predefined pattern by forming a pattern on an exposed surface of the seed crystal so as to provide regions of the seed crystal which extend beyond other regions of the seed crystal. Again, the pattern may include stripes in the seed crystal, a plurality of posts, and/or a plurality of substantially circular posts.

In still further embodiments of the present invention, nucleation sites are forced to the predefined pattern by forming a pattern of material other than silicon carbide on the silicon carbide seed crystal so as to provide a pattern of regions of having a reduced sticking coefficient over other regions of the seed crystal. Possible patterns may include stripes on the seed crystal, a plurality of posts on the seed crystal and/or a layer of material having a plurality of opening therein so as to expose potions of the seed crystal. The opening in the layer may be substantially circular. Furthermore, the material other than silicon carbide may be graphite.

In yet additional embodiments of the present invention, a seed crystal holder for growing silicon carbide using physical vapor transport is provided. The seed crystal holder has a body section configured to hold a silicon carbide seed crystal and a plurality of regions of differing thermal conductivity in the graphite body section. The regions of differing thermal conductivity have a predefined pattern and, along with the body section, are configured to produce a thermal profile in the seed crystal corresponding to the predefined pattern.

The plurality of regions may be a plurality of cavities in the body section. Alternatively, the plurality of regions of differing thermal conductivity may be configured to contact the seed crystal. In such embodiments, the regions of differing thermal conductivity may be regions of a material having a different thermal conductivity than the body section provided within the body section. The regions of differing thermal conductivity may have a lower thermal conductivity than the body section of the seed holder or a higher thermal conductivity than the body section of the seed holder. In particular embodiments of the present invention, the body section is made of graphite and the regions of differing thermal conductivity are regions of silicon carbide in the body section. Additionally, the predefined pattern comprise stripes in the seed crystal holder, a pattern of posts in the body section and/or a pattern of substantially circular posts.

In still further embodiments of the present invention, a silicon carbide seed crystal is provided. The silicon carbide seed crystal has a first surface and a second surface, opposite the first surface and a predefined pattern formed in the second surface so as to provide a plurality of regions of silicon carbide which extend a first distance form the first surface of the silicon carbide crystal and a plurality of other regions which extend a second distance, different from the first distance, from the first surface of the silicon carbide crystal. The pattern is preferably formed so as to preferentially grow silicon carbide in regions corresponding to the predefined pattern utilizing physical vapor transport growth. Furthermore, the first distance may be greater than the second distance. In such a case, the regions corresponding to the pattern may correspond to sidewalls of the regions of silicon carbide which extend the first distance from the first surface. The pattern may be stripes of trenches in the seed crystal, a plurality of posts and/or a plurality of substantially circular posts.

In additional embodiments of the present invention, a silicon carbide seed crystal is provided including a silicon carbide crystal having a first surface and a second surface, opposite the first surface and regions of a material other than silicon carbide on the second surface of the silicon carbide crystal. The material other than silicon carbide has a sticking coefficient associated with vapor phase transport growth of silicon carbide which is less than a sticking coefficient of silicon carbide. The pattern may be stripes of the material other than silicon carbide on the silicon carbide crystal, a plurality of posts, a plurality of substantially circular posts and/or a layer of the material other than silicon carbide having a plurality of openings to expose portions of the silicon carbide crystal. The openings may be substantially circular.

In further embodiments of the present invention, a silicon carbide crystal is provided having first regions of silicon carbide having a first defect density and second regions of silicon carbide having a second defect density, the second defect density being less that the first defect density. The first and second regions form a predefined pattern. The predefined pattern may be a pattern of stripes and/or a pattern of circles. The second defect density may be about five times less than the first defect density and, preferably, is about 10 times or more less than the first defect density.

DETAILED DESCRIPTION OF THE INVENTION

Figure 1:
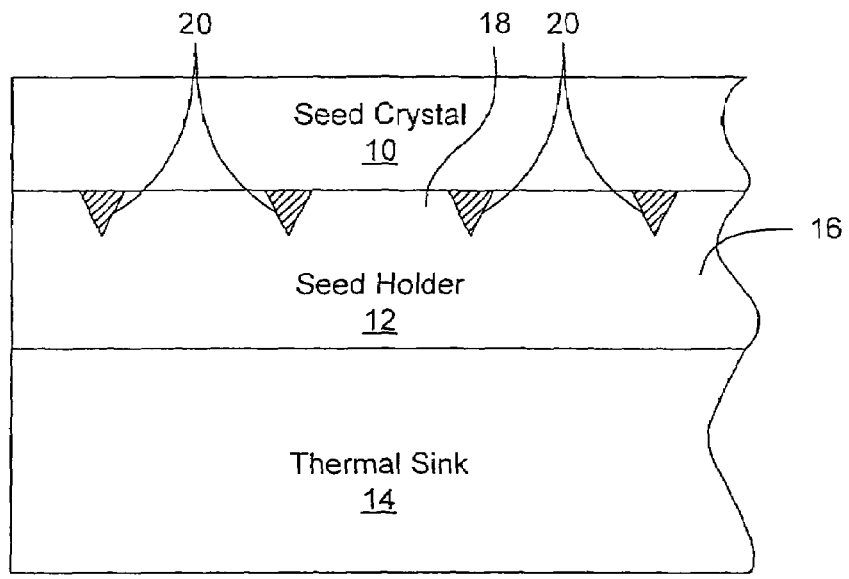
FIG. 1 is a schematic illustration of a seed crystal, a seed crystal holder and a thermal sink according to embodiments of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Embodiments of the present invention provide seed crystal holders, silicon carbide seed crystals and/or method of fabricating silicon carbide crystal. Embodiments of the present invention will now be described with reference to FIGS. 1 through 6. As seen in FIG. 1, a portion of an apparatus for producing silicon carbide crystals according to embodiments of the present invention is illustrated. The portion of the apparatus illustrated in FIG. 1 includes a silicon carbide seed crystal 10 on a seed crystal holder 12 which is, in turn, on a thermal sink 14. In the embodiments illustrated in FIG. 1, the seed holder 12 includes a main body portion 16 which has a first thermal conductivity and regions 20 which have a different thermal conductivity from the main body portion. The regions 20 of differing thermal conductivity divide the seed holder 12 into a pattern of regions 18 of a first thermal conductivity and regions 20 of a second thermal conductivity. The regions 20 of differing thermal conductivity may have the same or different thermal conductivities. Similarly, the pattern of regions 18 may have the same or different thermal conductivities.

The first conductivity may be higher or lower than the second, however, the differential in thermal conductivity should be large enough so as to provide a modulated thermal profile in the silicon carbide seed crystal 10 so that silicon carbide is preferentially grown in a pattern corresponding to the pattern of the regions 20 of differing thermal conductivity (e.g., if the first thermal conductivity is less than the second thermal conductivity) or to a pattern corresponding to the regions 18 of the seed holder 12 other than the regions 20 of differing thermal conductivity (e.g., if the first thermal conductivity is greater than the second thermal conductivity) when silicon carbide is grown by physical vapor transport (PVT) such as through a sublimation process. Such a modulated thermal profile provides regions of higher temperature and regions of lower temperature in the seed crystal 10 such that growth may preferentially occur in the regions of lower temperature over the regions of higher temperature. However, growth may occur in both regions. Thus, the term "preferential growth" refers to growth in a first region occurring more rapidly than growth in another region such that growth in the first region is "preferred" over growth in the other region.

The body 16 of the seed holder 12 is made of a material capable of withstanding the conditions of silicon carbide growth through PVT, such as sublimation. Preferably the body 16 of the seed holder 12 is made of graphite, which has a thermal conductivity of 24 W/m-K. The regions 20 of differing thermal conductivity are also preferably made of a material which may withstand such conditions. For example, for a graphite body seed holder 12, silicon carbide, which has a thermal conductivity of 110 W/m-K, may be used if a higher thermal conductivity is to be provided or unfilled openings may be provided if a lower thermal conductivity is to be provided. The regions 20 may be provided through mechanical and/or chemical removal of material from the body 16 of the seed holder 12. For example, trenches may be formed by etching, grinding, scratching, sawing or otherwise removing material from the body 16 of the seed holder 12. Similarly, if substantially circular regions 20 are desired, the body 16 of the seed holder 12 may be etched or drilled to provide such cavities. Alternatively, the seed holder 12 could be originally formed in the desired shape.

If the regions 20 are to be filled with a material, such as silicon carbide, such could be provided by depositing a layer of silicon carbide on the body 16 of the seed holder 12 to fill the regions 20 and then grinding, etching or otherwise removing excess material until the regions 18 are exposed while leaving the regions 20 filled with the material. The seed crystal 10 could then be mounted on the seed holder 12 such that the regions 20 and the regions 18 were in contact with the seed crystal 10.

The physical dimensions of the regions 20 may vary depending on the material utilized to fill the regions 20, if any, but should be large enough so as to provide a modulated thermal profile of the seed crystal 10 so as to cause preferential growth of silicon carbide on the seed crystal 10 either in areas corresponding to one of the regions 20 or the regions 18. For example, for a graphite seed holder with the regions 20 filled with silicon carbide, the regions 20 may have a depth of from about 1 mm to about 20 mm and have a width of from about 0.5 mm to about 5 mm. Furthermore, the spacing between the regions 20 may be about 0.5 mm or greater and, preferably, is from about 0.5 mm to about 3 mm or greater.

Figure 2:
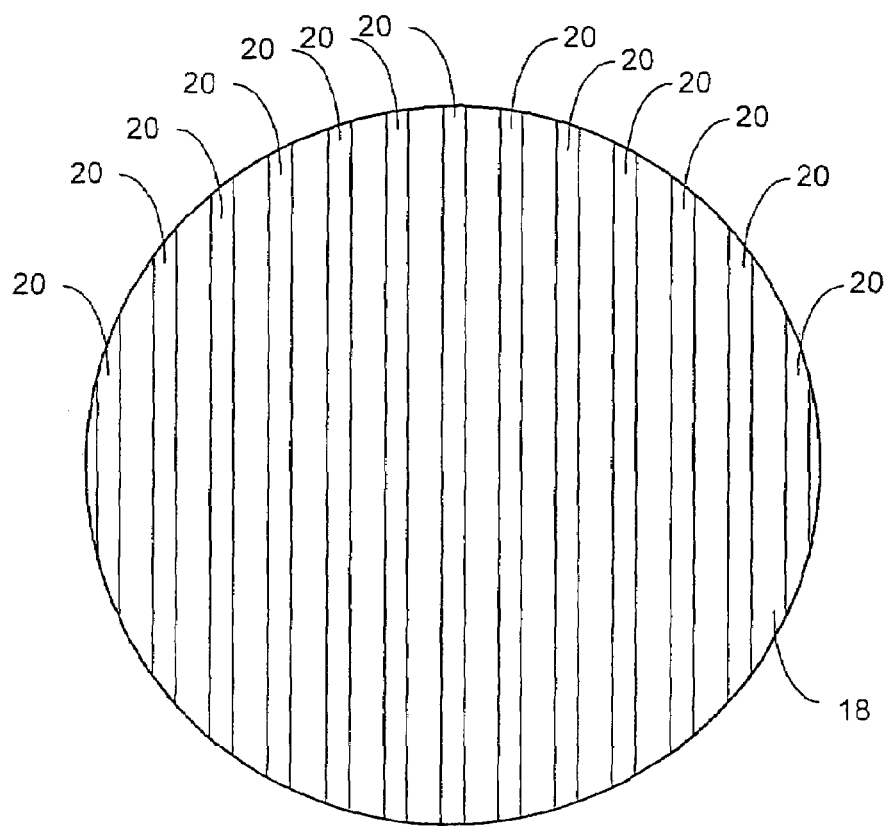
FIG. 2 is a schematic illustration of a seed crystal holder according to embodiments of the present invention.
Figure 3:
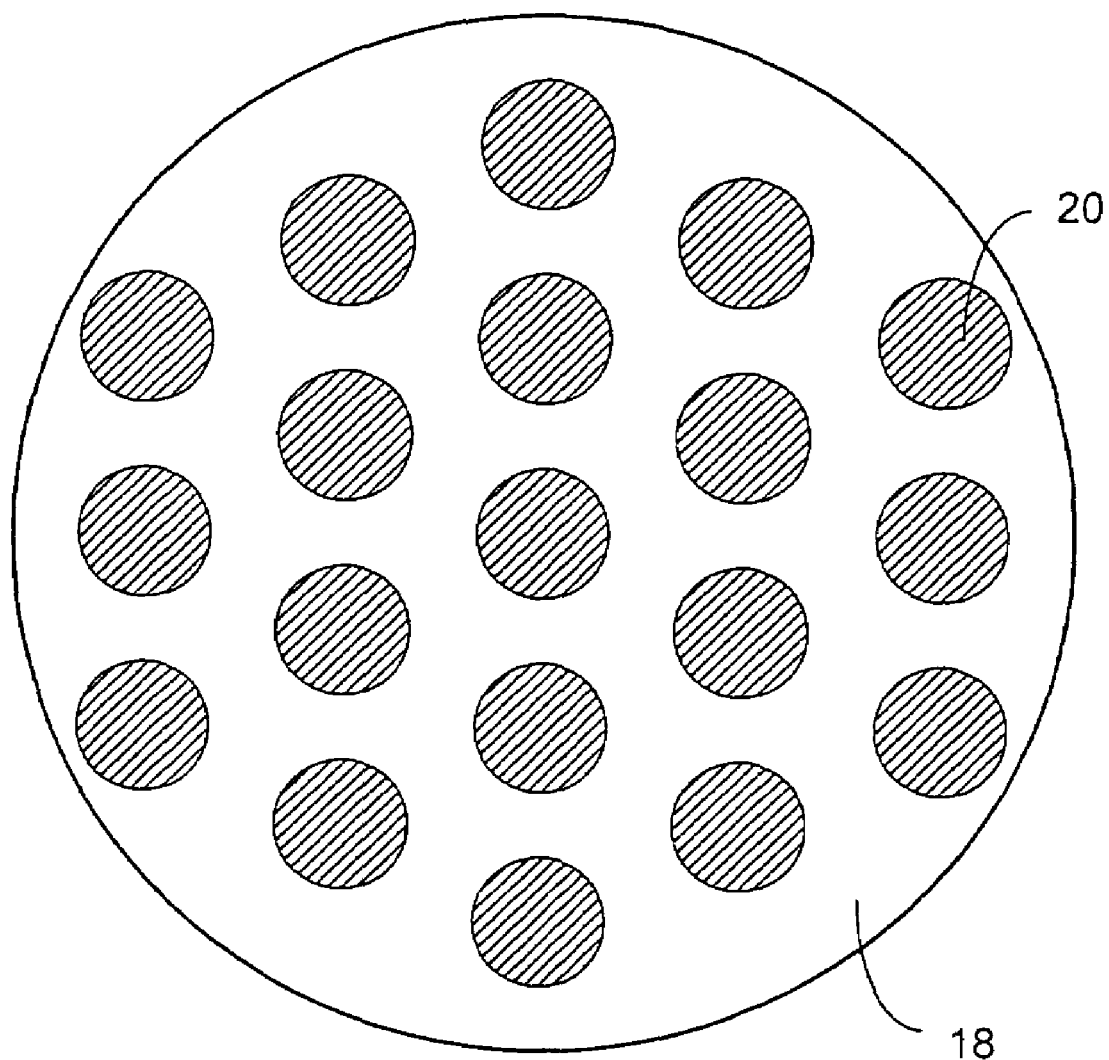
FIG. 3 is a schematic illustration of a seed crystal holder according to embodiments of the present invention.

As briefly discussed above, the regions 20 of differing thermal conductivity may be provided in various predefined patterns. Preferably, these patterns are symmetric patterns. Two of such patterns are illustrated in FIGS. 2 and 3. As seen in FIG. 2, the seed holder 12 may be a substantially circular disk and the regions 20 may be provided as a plurality of trenches extending across the disk with the regions 18 being provided therebetween so as to provide a striped pattern. The center-to-center spacing of the trenches 20 may be about 0.5 mm or greater and the trenches may be from about 0.5 mm to about 5 mm in width.

As seen in FIG. 3, the regions 20 may be circular in shape. The circular regions 20 may have a diameter of from about 0.5 mm to about 5 mm and a center-to-center spacing of from about 0.5 mm or greater. Preferably, the circular regions 20 may be provided in an ordered pattern, however, an asymmetric or periodic pattern could be utilized.

In addition to the patterns illustrated in FIGS. 2 and 3, other patterns may also be utilized. For example, multiple striped patterns could be utilized to provide patterns of rectangles, diamonds or triangles. Similarly, other geometric shapes could also be utilized such as ellipses or the like. The patterns may be regular, irregular, symmetric, asymmetric, periodic, non-periodic and/or combinations thereof.

The seed holders 12 illustrated in FIGS. 1 through 3 may be utilized in PVT growth of silicon carbide crystals. The seed holders 12 according to embodiments of the present invention may be utilized in conjunction with conventional PVT techniques, such as those described above in the patents incorporated herein by reference, to provide silicon carbide crystals with reduced defects. For example, through the use of the seed holders 12 according to embodiments of the present it is expected that micropipes may be reduced by up to a factor of 5 or even a factor of 10 depending on the original quality of the seed crystal.

Figure 4A:
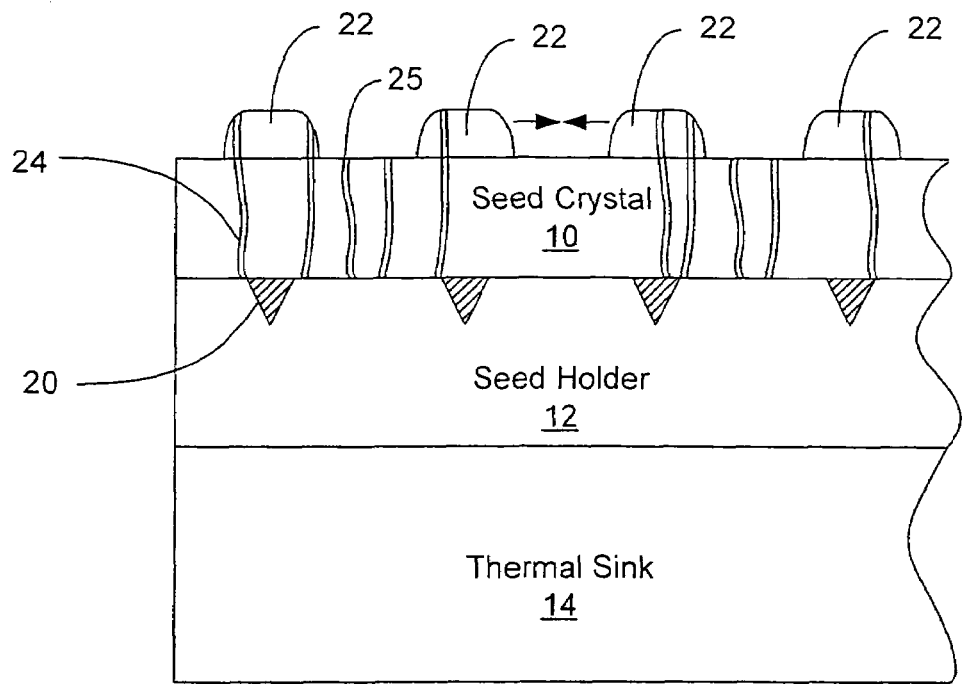
FIGS. 4A and 4B are schematic illustrations illustrating fabrication of a silicon carbide crystal according to embodiments of the present invention.
Figure 4B:
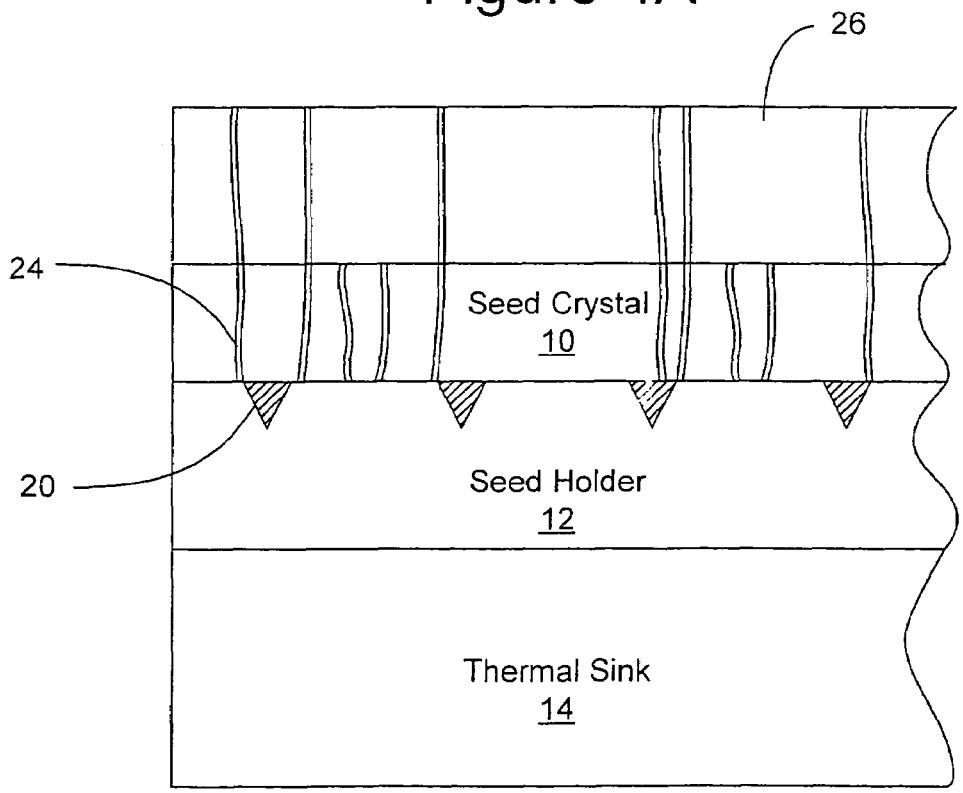

While not wishing to be bound to a particular theory of operation, FIGS. 4A and 4B are an illustration of growth of silicon carbide crystal from a seed crystal 10 mounted on a seed holder 12 according to embodiments of the present invention. As seen in FIG. 4A, the seed crystal 10 includes micropipes 24 which are located in a region where preferential growth occurs as a result of the increased thermal conductivity provided by the region 20 and micropipes 25 which are not located in a region of preferential growth. When growth begins, because of the modulation of the thermal profile resulting from the regions 20, growth is preferential in the areas of reduced temperature provided by the regions 20. Thus, the growth regions 22 will initially form in a pattern corresponding to the pattern of the regions 20. As can be seen in FIG. 4A, the micropipes 24 may propagate into these regions. However, the micropipes do not propagate in a lateral direction. As growth continues, growth will be primarily from the sidewalls of the growth regions 22 as illustrated by the arrows in FIG. 4A. The sidewalls of the growth regions 22 eventually grow together to provide a continuous region of silicon carbide, however, as seen in FIG. 4B, the micropipes do not propagate in a lateral direction from the sidewalls and, therefore, the micropipes present in the silicon carbide crystal 26 may be reduced over those present in a silicon carbide crystal which did not experience the preferential growth provided by the seed holders 12.

Figure 5:
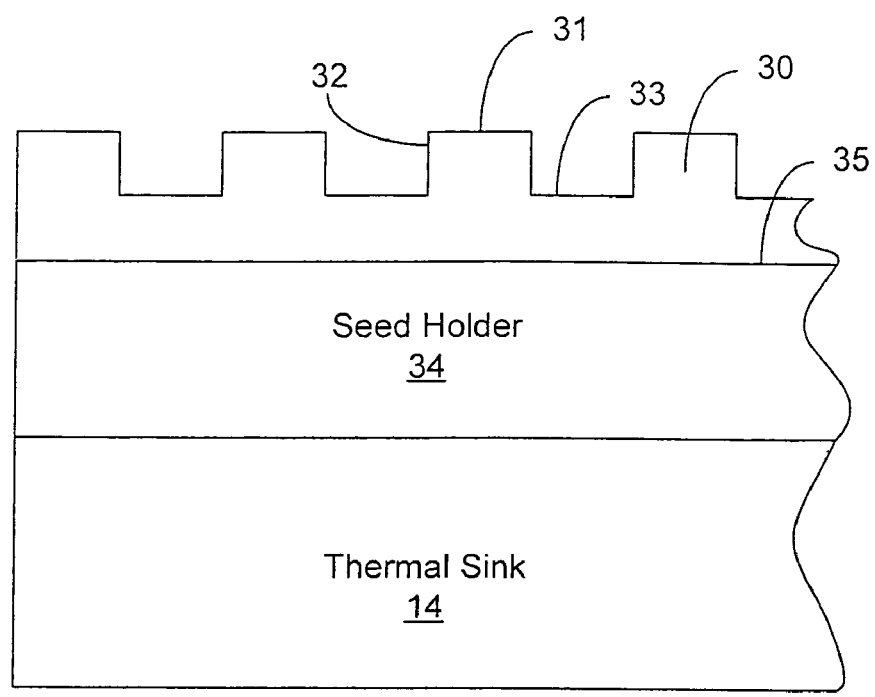
FIG. 5 is a schematic illustration of a silicon carbide seed crystal according to embodiments of the present invention.

FIG. 5 illustrates further embodiments of the present invention where a conventional seed crystal holder 34 is utilized with a silicon carbide seed crystal 30 having a pattern provided therein. Silicon carbide is grown from the silicon carbide seed crystal 30 utilizing PVT, such as through a sublimation growth process. The silicon carbide crystal 30 has a first surface 35 and a second surface 31, opposite the first surface 35. The pattern formed in the second surface 31 is formed so to provide a plurality of regions 32 of silicon carbide which extend a first distance from the first surface 35 of the silicon carbide crystal and a plurality of other regions 33 which extend a second distance, different from the first distance, from the first surface 35 of the silicon carbide crystal 30.

The pattern formed by the regions 32 and 33 may be trenches, rectangles, circles, posts, or the like or combinations thereof. For example, the pattern may be as illustrated in FIGS. 2 and 3 and as described above with reference to the regions 20. The difference between the first distance and the second distance may provide a depth of from about 0.25 mm and about 3 mm. Furthermore, adjacent regions 32 or adjacent regions 33 may be spaced at a center-to-center distance of from about 0.5 mm to about 3 mm or greater. The regions 32 may have a width (sidewall to sidewall) of from about 0.5 mm to about 5 mm. Similarly, the regions 33 may have a width of from about 0.5 mm to about 5 mm.

The regions 32 and 33 may be provided through mechanical and/or chemical removal of material from a conventional silicon carbide seed crystal. For example, trenches may be formed by etching, grinding, scratching, sawing or otherwise removing material from a conventional seed crystal. Similarly, if a pattern of substantially circular regions are desired, a conventional seed crystal could be etched or drilled to provide such cavities.

By providing a pattern in the silicon carbide seed crystal 30, the location of nucleation sites may be controlled so as to provide preferential growth corresponding to the pattern of the seed crystal 30. Thus, for example, in the configuration illustrated in FIG. 5, growth would be preferential from the sidewalls of the regions 32. Thus, it is believed that micropipes and/or other defects may be reduced by providing a pattern in the seed crystal 30 for substantially the same reasons as discussed above with reference to FIGS. 4A and 4B.

Figure 6:
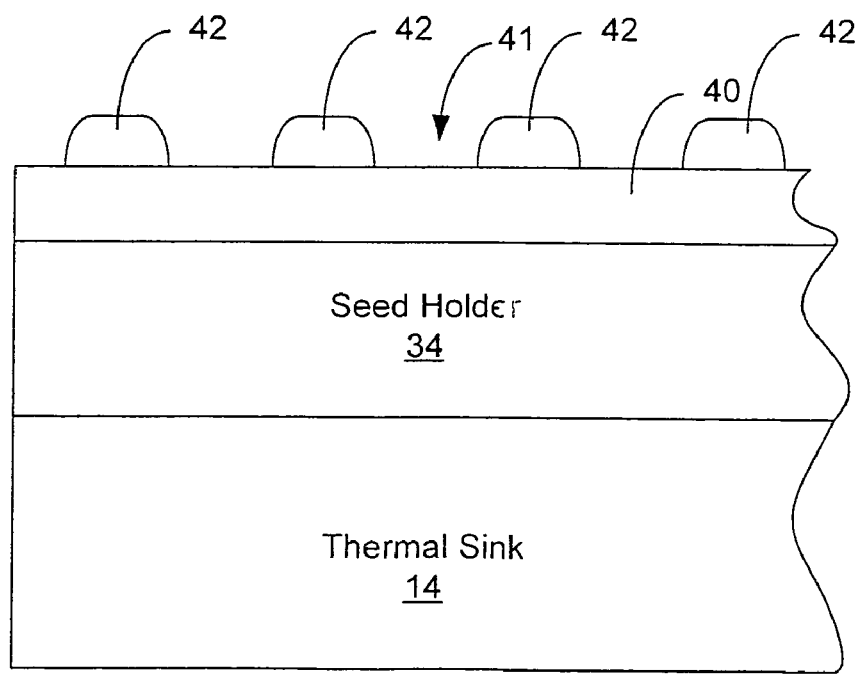
FIG. 6 is a schematic illustration of a silicon carbide seed crystal having regions of other material thereon according to embodiments of the present invention.

FIG. 6 illustrates further embodiments of the present invention where nucleation sites are controlled by modulating the sticking coefficient of the silicon seed crystal 40 through the inclusion of regions 42 of material having a lower sticking coefficient that that of silicon carbide so that silicon carbide is preferentially grown in the regions 41 of the seed crystal 40. Thus, the silicon carbide seed crystal 40 can be patterned with regions of material 42, such as graphite, which provides a mask pattern to control the pattern of nucleation. In such embodiments, during a PVT growth process, such as a sublimation growth process, silicon carbide will preferentially grow in the regions 41. Such growth will eventually laterally overgrow the regions 42 such that micropipes and/or other defects present in the regions 41 will not propagate into the regions which overly the regions 42. Accordingly, the number of defects in the resulting silicon carbide crystals may be reduced.

The pattern of the regions 42 may be similar to the patterns described above. Furthermore, the dimensions of the regions 42 may be similar to the dimensions of the regions 32 and/or 33 of FIG. 5. The regions 42 may be provided by forming a layer of graphite or other low sticking coefficient material on a conventional silicon carbide seed crystal and etching or mechanically removing portions of the graphite to provide the regions 42 in the desired pattern.

As can be seen from the above discussion, embodiments of the present invention may provide silicon carbide crystals with reduced defects. Furthermore, as a result of use of various embodiments of the present invention the resulting silicon carbide crystals may have first regions which have a first defect density and second regions which have a second defect density which is less than the first defect density. For example, as illustrated in FIGS. 4A and 4B, the silicon carbide crystal 26 may have regions where defects, such as the micropipes 24, propagate from the seed crystal 10 and regions where such defects do not propagate. Such a reduction in defect density may not result if thermal modulation, surface modulation or sticking coefficient modulation is carried out after a substantial amount of silicon carbide has been grown. Thus, in preferred embodiments of the present invention, such techniques for controlling nucleation sites are carried out to control nucleation sites in a seed crystal.

In the embodiments of the present invention illustrated in FIG. 1, such first regions would correspond to regions of preferential growth and the second regions would correspond to regions where lateral growth had occurred. Thus, for example, if the regions 20 have a higher thermal conductivity than the body 16 of the seed holder 12, the first regions would be above the regions 20 and the second regions would be above the body of the seed holder. The regions, however, would be reversed if the regions 20 had a thermal conductivity of less than the thermal conductivity of the body 16 of the seed holder. Similarly, in the embodiments illustrated in FIG. 5, the first regions would correspond to regions above the regions 32 and the second regions would correspond to regions above the regions 33 of the seed crystal 30. In the embodiments illustrated in FIG. 6, the first regions would correspond to regions above the regions 41 of the seed crystal 40 and the second regions would correspond to regions above the regions 42 of the mask.

Silicon carbide crystals according to embodiments of the present invention may have regions therein with a reduction in defect density of a factor of up to 5 or more and preferably a factor of 10 or more over other regions in the silicon carbide crystals. Such regions of higher and lower defect density may, generally, correspond to the pattern provided in the seed holder, the seed crystal or the mask on the seed crystal. Furthermore, it may be preferable to form a semiconductor device or devices in the regions of lower defect density to thereby provide semiconductor devices with improved electrical characteristics over a corresponding device in a region of higher defect density.

As used herein, the term defect density refers to a number of defects per unit area. Such unit area may correspond to an area in which a semiconductor device may be formed or may correspond to an area defined by the pattern of the seed holder, the seed crystal or the mask on the seed crystal. Measurement of defect density may be made using conventional defect measurement techniques, such as those used in measuring micropipes and/or dislocation defects in silicon carbide. Such techniques may include, for example, preferential etching of SiC wafers in molten KOH, analysis by synchrotron-white beam x-ray topography and/or optical transmission light microscopy. See e.g. R. Yakimova, A. L. Hylen, M. Tuominen, M. Syvajarvi, E. Janzen, Diamond and Related Materials, 6 (1997), pp. 1456-1458 and Weimin Si, Michael Dudley, Hua-Shuang Kong, Joe Sumakeris, and Calvin Carter, Jr., Journal of Electronic Materials, Vol. 26, No. 3, 1997.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of producing a silicon carbide boule having a substantially single polytype, the method comprising:

forcing preferential nucleation sites on a surface of a silicon carbide seed crystal having the substantially single polytype to a predefined pattern; and growing the silicon carbide boule utilizing physical vapor transport (PVT) so as to provide selective preferential growth of silicon carbide on the silicon carbide seed crystal corresponding to the predefined pattern;

wherein forcing preferential nucleation sites comprises forming a pattern on the surface of the seed crystal so as to provide first regions of the seed crystal which extend beyond second regions of the seed crystal; and wherein forming a pattern comprises forming a pattern of vertical sidewalls in the exposed surface of the seed crystal wherein the vertical sidewalls are perpendicular to the surface of the silicon carbide seed crystal; and wherein growing the silicon carbide boule comprises preferentially growing silicon carbide from the vertical sidewalls.

2. The method of claim 1, wherein the pattern comprises stripes in the seed crystal.

3. The method of claim 2, wherein a center to center spacing of adjacent stripes is about 0.5 mm to about 3 mm.

4. The method of claim 1, wherein the pattern comprises a plurality of posts.

5. The method of claim 4, wherein the posts are substantially circular.

6. The method of claim 1, wherein the first regions extend beyond the second regions by a distance of about 0.25 mm to about 0.3 mm.

7. The method of claim 1, wherein the second regions have widths of about 0.5 mm to about 5 mm.

8. The method of claim 1, wherein the first regions have widths of about 0.5 mm to about 5 mm.

* * * * *